(12) United States Patent
Herchen et al.

(10) Patent No.: US 7,025,862 B2
(45) Date of Patent: Apr. 11, 2006

(54) PLATING UNIFORMITY CONTROL BY CONTACT RING SHAPING

(75) Inventors: Harald Herchen, Los Altos, CA (US); Henan Hao, Fremont, CA (US); Celina M. Esteban, Redwood City, CA (US); Timothy R. Webb, San Mateo, CA (US); Son N. Trinh, Cupertino, CA (US)

(73) Assignee: Applied Materials, Santa Clara, CA (US)

( * ) Notice: Subject to any disclaimer, the term of this patent is extended or adjusted under 35 U.S.C. 154(b) by 544 days.

(21) Appl. No.: 10/278,527

(22) Filed: Oct. 22, 2002

(65) Prior Publication Data

US 2004/0074761 A1 Apr. 22, 2004

(51) Int. Cl.
*C25B 9/00* (2006.01)

(52) U.S. Cl. .................. 204/297.06; 204/297.08; 204/297.09; 204/297.1; 204/199; 204/213; 204/224 R; 29/825; 29/874; 29/729; 29/745

(58) Field of Classification Search ............ 204/297.06, 204/297.08, 297.09, 297.1, 199, 213, 224 R; 29/825, 874, 725, 745
See application file for complete search history.

(56) References Cited

U.S. PATENT DOCUMENTS

| | | | |
|---|---|---|---|
| 4,304,641 A | 12/1981 | Grandia et al. | |
| 4,341,613 A | 7/1982 | Prusak et al. | |
| 5,620,581 A | 4/1997 | Ang | |
| 5,744,019 A | 4/1998 | Ang | |
| 5,985,126 A | 11/1999 | Bleck et al. | |
| 6,001,234 A | 12/1999 | Batz, Jr. et al. | |
| 6,004,440 A | 12/1999 | Hanson et al. | |
| 6,004,828 A | 12/1999 | Hanson | |
| 6,017,437 A | 1/2000 | Ting et al. | |
| 6,022,465 A | 2/2000 | Ting et al. | |
| 6,080,289 A | 6/2000 | Palmatier et al. | |
| 6,080,291 A | 6/2000 | Woodruff et al. | |
| 6,090,711 A | 7/2000 | Batz, Jr. et al. | |
| 6,139,703 A | 10/2000 | Hanson et al. | |
| 6,139,712 A | 10/2000 | Patton et al. | |
| 6,156,167 A | 12/2000 | Patton et al. | |
| 6,159,354 A | 12/2000 | Contolini et al. | |
| 6,179,983 B1 | 1/2001 | Reid et al. | |
| 6,193,859 B1 | 2/2001 | Contolini et al. | ....... 204/224 R |
| 6,251,236 B1* | 6/2001 | Stevens | .................. 204/224 R |
| 6,261,433 B1 | 7/2001 | Landau | |

(Continued)

FOREIGN PATENT DOCUMENTS

JP 2001-200392 7/2001

OTHER PUBLICATIONS

PCT Search Report dated Apr. 21, 2004 for PCT/US03/33264.

*Primary Examiner*—Bruce F. Bell
(74) *Attorney, Agent, or Firm*—Patterson and Sheridan

(57) ABSTRACT

An apparatus for providing an electrical bias to a substrate in a processing system is described. The apparatus generally includes a conductive annular body defining a central opening. The conductive annular body may have a substrate seating surface adapted to receive the substrate and a plurality of scallops formed on a surface opposing the substrate seating surface. A plurality of electrical contacts may be formed on the substrate seating surface opposite the plurality of scallops. The electrical contacts may be adapted to engage a plating surface of the substrate.

36 Claims, 6 Drawing Sheets

U.S. PATENT DOCUMENTS

| | | |
|---|---|---|
| 6,270,647 B1 | 8/2001 | Graham et al. |
| 6,274,013 B1 | 8/2001 | Bleck et al. |
| 6,309,524 B1 | 10/2001 | Woodruff et al. |
| 6,343,793 B1 | 2/2002 | Patton et al. |
| 6,358,388 B1 | 3/2002 | Bleck et al. |
| 6,402,923 B1 | 6/2002 | Mayer et al. .................. 205/96 |
| 6,423,636 B1 | 7/2002 | Dordi et al. |
| 6,432,282 B1 | 8/2002 | Shamouilian et al. .... 204/228.1 |
| 6,436,249 B1 | 8/2002 | Patton et al. |
| 6,482,307 B1 | 11/2002 | Ashjaee et al. |
| 6,497,800 B1 | 12/2002 | Talieh et al. |
| 6,514,393 B1 | 2/2003 | Contolini et al. |
| 6,589,401 B1 | 7/2003 | Patton et al. |
| 6,613,214 B1 | 9/2003 | Dordi et al. |
| 2002/0000380 A1 | 1/2002 | Graham et al. |
| 2003/0079995 A1 | 5/2003 | Contolini et al. |
| 2003/0173209 A1 | 9/2003 | Batz, Jr. et al. |
| 2003/0196892 A1 | 10/2003 | Batz, Jr. et al. |

* cited by examiner

PLATING UNIFORMITY CONTROL BY CONTACT RING SHAPING

BACKGROUND OF THE INVENTION

1. Field of the Invention

Embodiments of the invention generally relate to electrochemical plating and, more particularly, to a contact ring for providing an electrical bias to a substrate during an electrochemical plating process.

2. Description of the Related Art

Metallization of sub-quarter micron sized features is a foundational technology for present and future generations of integrated circuit manufacturing processes. More particularly, in devices such as ultra large scale integration-type devices, i.e., devices having integrated circuits with more than a million logic gates, the multilevel interconnects that lie at the heart of these devices are generally formed by filling high aspect ratio (greater than about 4:1, for example) interconnect features with a conductive material, such as copper or aluminum, for example. Conventionally, deposition techniques such as chemical vapor deposition (CVD) and physical vapor deposition (PVD) have been used to fill these interconnect features. However, as the interconnect sizes decrease and aspect ratios increase, void-free interconnect feature fill via conventional metallization techniques becomes increasingly difficult. As a result thereof, plating techniques, such as electrochemical plating (ECP) and electroless plating, for example, have emerged as promising processes for void free filling of sub-quarter micron sized high aspect ratio interconnect features in integrated circuit manufacturing processes.

In an ECP process, for example, sub-quarter micron sized high aspect ratio features formed into the surface of a substrate (or a layer deposited thereon) may be efficiently filled with a conductive material, such as copper, for example. ECP processes are generally two stage processes, wherein a seed layer is first formed over the surface features of the substrate, and then the surface features of the substrate are exposed to a plating solution, while an electrical bias is simultaneously applied between the substrate and a copper anode positioned within the plating solution. The plating solution is generally rich in ions to be plated onto the surface of the substrate, and therefore, the application of the electrical bias causes these ions to be urged out of the plating solution and to be plated onto the seed layer.

The electrical bias is typically applied to the seed layer formed on the substrate via a conductive contact ring. In an effort to provide a uniform electrical bias to the substrate, the contact ring may have a plurality of electrical contacts configured to electrically contact the seed layer along a perimeter edge of the substrate at evenly spaced intervals. The electrical contacts typically apply a negative voltage to the seed layer of the substrate, creating a current density across the seed layer, which has an associated resistance. A current path through the seed layer to the electrical contacts increases at points farther away from the electrical contacts relative to points nearer the electrical contacts. Unfortunately, along with this increased current path comes an increased seed layer resistance, which leads to a decrease in current at points between the contacts relative to points at or near the contacts. In general, this decrease in current leads to decreased plating at points on the seed layer. Consequently, this decrease in current between the contacts may lead to plating nonuniformities along the perimeter edge of the substrate in the form of less plating between the contacts and more plating at or near the contacts.

Therefore, there is a need for an improved contact ring for use in an electrochemical deposition system that results in improved plating uniformity along a perimeter edge of a substrate.

SUMMARY OF THE INVENTION

One embodiment of the present invention provides an apparatus for providing an electrical bias to a substrate in a processing system. The apparatus generally includes a conductive annular body defining a central opening, the conductive annular body having a substrate seating surface adapted to receive the substrate and a plurality of protrusions formed on a surface opposing the substrate seating surface. A plurality of electrical contacts may be formed on the substrate seating surface opposite the plurality of protrusions, the electrical contacts adapted to engage a plating surface of the substrate.

Another embodiment provides an apparatus for securing a substrate in a processing system generally including a contact ring including a conductive annular body defining a central opening, the conductive annular body having a substrate seating surface, a plurality of electrical contacts disposed on the substrate seating surface, the electrical contacts adapted to engage a plating surface of the substrate, and a plurality of protrusions formed opposite the electrical contacts on a surface opposing the substrate seating surface. The apparatus may also include a thrust plate assembly including a thrust plate adapted to exert a securing force on the substrate to secure the substrate to the substrate seating surface.

Another embodiment provides a method of fabricating a contact ring for providing an electrical bias to a substrate in a processing system. The method generally includes providing a conductive annular ring having a substantially flat first surface adapted to receive the substrate and a second surface opposing the first surface, wherein a plurality of protrusions extend from the second surface, and forming a plurality of electrical contacts on the first surface of the conductive annular ring, wherein the plurality of electrical contacts are formed opposite the plurality of protrusions.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are, therefore, not to be considered limiting of its scope, for the invention may admit to other equally effective embodiments.

DETAILED DESCRIPTION OF THE PREFERRED EMBODIMENT

According to some aspects of the present invention, a contact ring having a plurality of electrical contacts is provided to supply an electrical bias to a substrate in a processing system. An average thickness of the contact ring may be increased via protrusions, or "scallops," formed in the contact ring below the contacts. The scallops may help control variations in current density between the contacts by compensating for increased seed layer resistance that exists between the contacts.

As used herein, the term scallop generally refers to portions of a contact ring having an increased thickness at or near the contacts relative to (thinner) portions of the contact ring in between the contacts. For example, scallops may be formed on a bottom surface of a contact ring, below electrical contacts. Further, as used herein, top and bottom are relative terms, not limited to any specific orientation, generally applying to portions of a contact ring away from (top) or facing (bottom) a plating bath. In other words, in a processing system where a plating surface of a substrate faces up, what is referred to herein as a top surface of the contact ring may actually face down.

Figure 1:
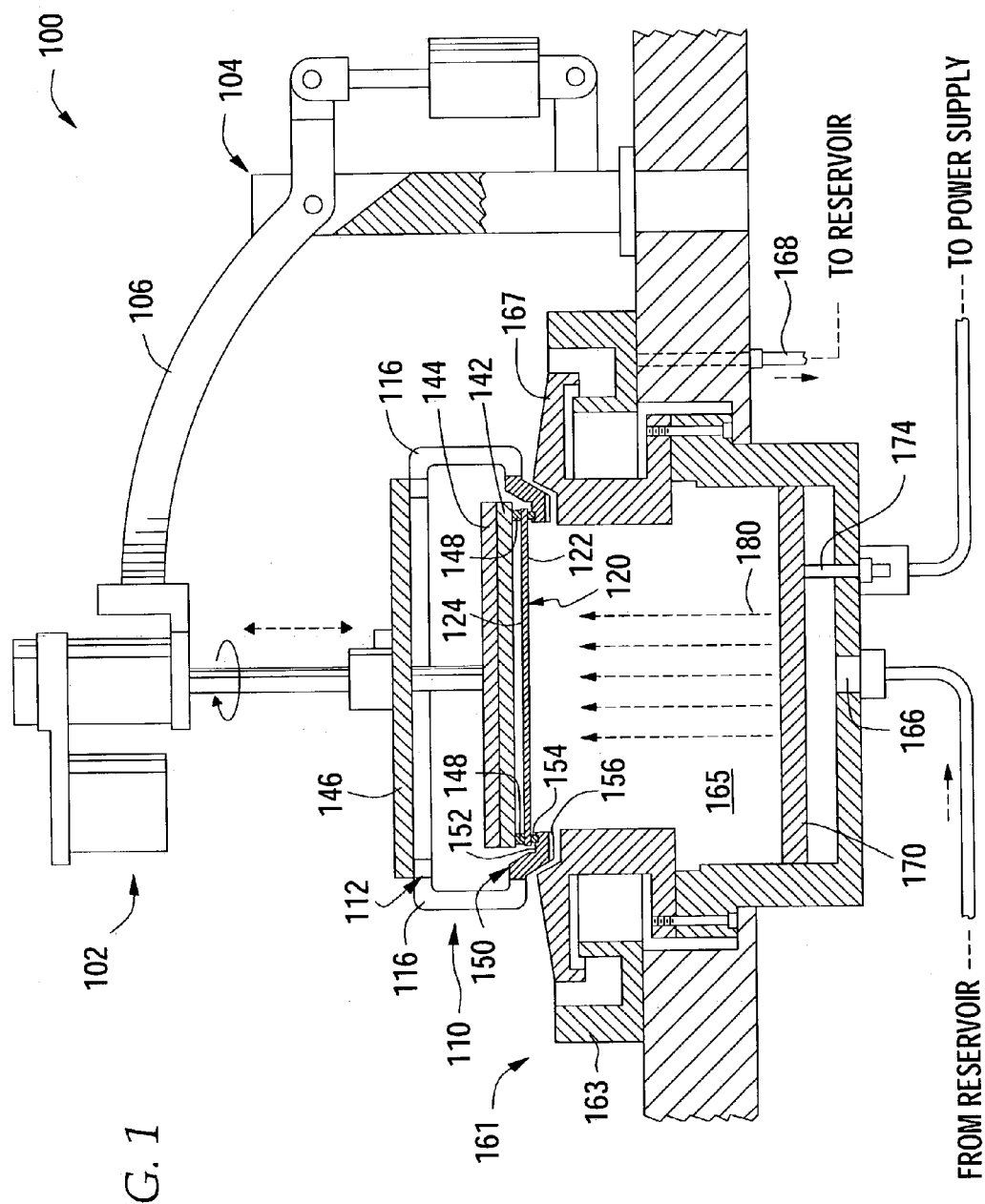
FIG. 1 illustrates an exemplary plating cell according to one embodiment of the present invention.

FIG. 1 illustrates a partial perspective and sectional view of an exemplary electrochemical plating (ECP) system 100 utilizing a contact ring 150 with scallops 156 according to one embodiment of the present invention. The ECP system 100 generally includes a head assembly 102, a substrate securing assembly 110 and a plating bath assembly 161. The head assembly 102 is attached to a base 104 by a support arm 106. The head assembly 102 is adapted to support the substrate securing assembly 110 at a position above the plating bath assembly 161 in a manner that allows the head assembly 102 to position a substrate 120 (held in the substrate securing assembly 110) in a plating bath 165 for processing. The head assembly 102 may also be adapted to provide vertical, rotational, and angular movement to the substrate securing assembly 110 before, during, and after the substrate 120 is placed in the plating bath 165.

The plating bath assembly 161 generally includes an inner basin 167, contained within a larger diameter outer basin 163. Any suitable technique may be used to supply a plating solution to the plating assembly 160. For example, a plating solution may be supplied to the inner basin 167 through an inlet 166 at a bottom surface of the inner basin 167. The inlet 166 may be connected to a supply line, for example, from a reservoir system (not shown). The outer basin 163 may operate to collect fluids from the inner basin 163 and drain the collected fluids via a fluid drain 168, which may also be connected to the electrolyte reservoir system.

An anode assembly 170 is generally positioned within a lower region of the inner basin 163. The anode assembly 170 may be any suitable consumable or non-consumable-type anode. For some embodiments, a membrane (not shown) may be generally positioned across the diameter of inner basin at a position above the anode assembly 170. The membrane may be any suitable type membrane, such as a cation membrane, an anion membrane, an uncharged-type membrane, or a multi-layer diffusion differentiated permeable membrane. Any suitable method may be used to provide an electrical connection to the anode assembly 170.

For example, an electrical connection to the anode assembly 170 may be provided through an anode electrode contact 174. The anode electrode contact 174 may be made from any suitable conductive material that is insoluble in the plating solution, such as titanium, platinum and platinum-coated stainless steel. As illustrated, the anode electrode contact 174 may extend through a bottom surface of the plating bath assembly 161 and may be connected to an anode connection of a power supply (not shown), for example, through any suitable wiring conduit. A cathode connection of the power supply may be connected to the contact ring 150 to supply an electrical bias between the anode assembly 170 and the substrate 120. In response to the electrical bias applied between the anode assembly 170 and a plating surface 122 of the substrate 120, electrical current, represented by current flux lines 180, generally flows from the anode assembly 170 to the substrate 120. The current flux lines 180 may tend to gather at a perimeter edge of the substrate 120. Therefore, the contact ring 150 may include a plurality of scallops 156 generally formed beneath a plurality of contacts 154. The scallops 156 may serve to control the current flux lines 180 at the perimeter edge of the substrate 120 at or near the contacts 154, in an effort to control variations in current density along a perimeter edge of the substrate 120, as will be described in more detail below.

SUBSTRATE SECURING ASSEMBLY

The substrate securing assembly 110 generally includes a mounting member 112 attached to the contact ring 150 via attachment members 116. The attachment members 116 may be spaced sufficiently to allow insertion of the substrate 120 (i.e., a spacing of the attachment members 116 may be greater than a diameter of the substrate 120). The mounting member 112 may allow for attachment of the substrate securing assembly 110 to the head assembly 102, via a mounting plate 146 of a thrust plate assembly. Other embodiments of the substrate securing assembly 110 may lack the mounting member 112 and may be attached, for example, directly to the mounting plate 146 via the contact ring 150. The mounting member 112, contact ring 150, and the attachment members 116 may each be coated with a plating-resistant material, such as a PTFE material (e.g., Aflon® or Tefzel®) or any other suitable plating-resistant coating material.

The contact ring 150 may have a substrate seating surface 152 generally adapted to receive the substrate 120 with the plating surface 122 of the substrate facing the plating bath 165. The substrate securing assembly 110 may also include a thrust plate 144 with an attached seal plate 142 generally adapted to exert a securing force on the substrate 120 for securing the substrate 120 to the substrate seating surface 152. The securing force applied by the thrust plate 144 may be sufficient to ensure adequate sealing between an annular sealing member 148 disposed on the seal plate 142 and the non-plating surface 124 of the substrate. As illustrated, the annular sealing member 148 may be adapted to contact the non-plating surface 124 of the substrate 120 at a substantially equal location radially inward from an edge of the substrate as the contacts 154 engage the plating surface 122 of the substrate. For some embodiments, the substrate securing assembly 110 may include an inflatable bladder assembly (not shown) adapted to apply a downward force that is evenly distributed along the non-plating surface 124 of the substrate 120.

The securing force exerted by the thrust plate 144 may also be sufficient to ensure adequate electrical contact between the plating surface 122 of the substrate and the contacts 154 extending from the substrate seating surface 152 of the contact ring 150. The contacts 154 are generally adapted to electrically contact the plating surface 122 of the substrate 120 in order to supply an electrical plating bias to the plating surface 122. The contacts 154 may be made of any suitable conductive material, such as copper (Cu), platinum (Pt), tantalum (Ta), titanium (Ti), gold (Au), silver (Ag), stainless steel, an alloy thereof, or any other suitable conducting material.

Figure 2:
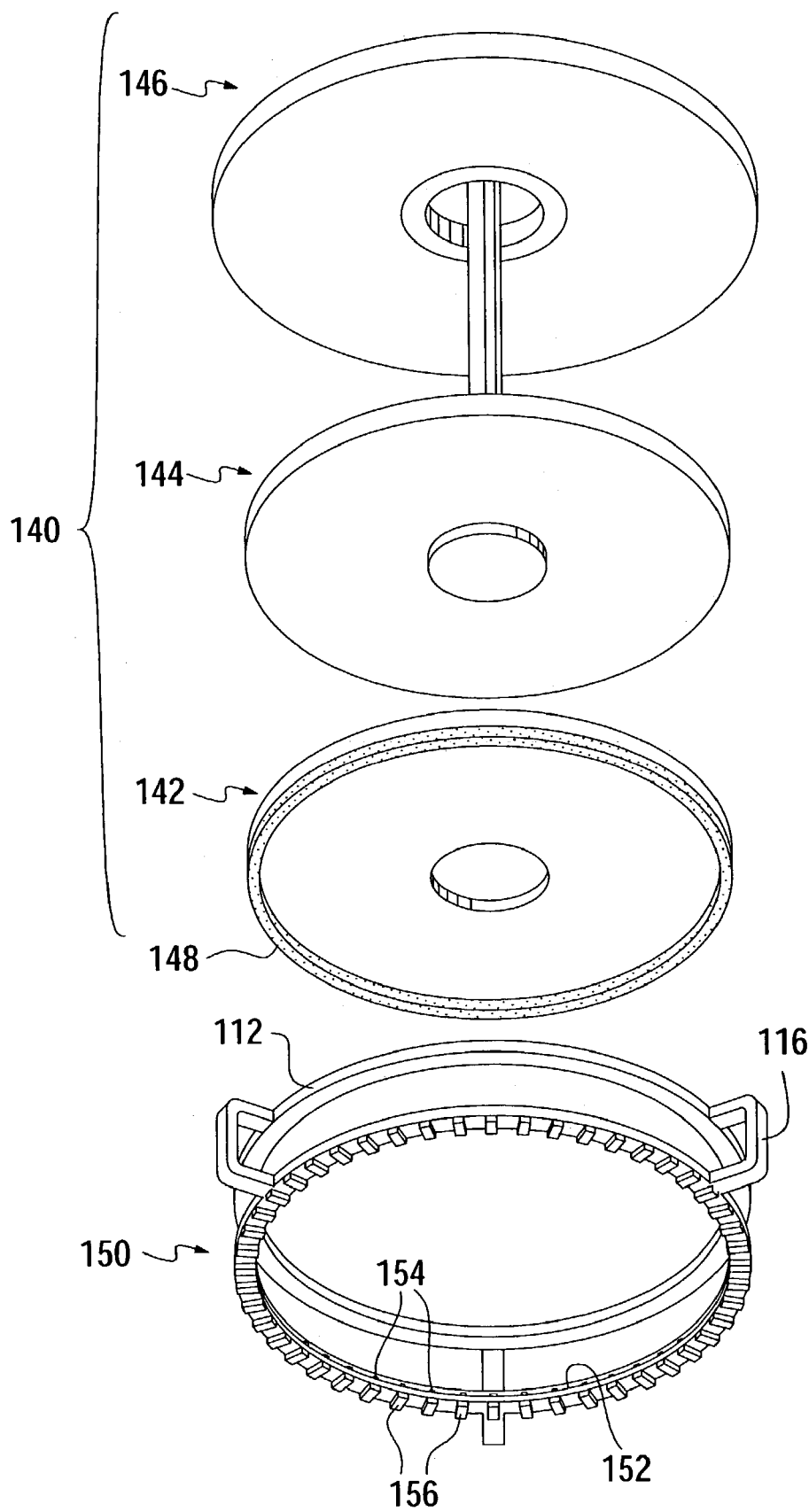
FIG. 2 is a perspective view of a contact ring and thrust plate assembly according to one embodiment of the present invention.

As illustrated in FIG. 2, the contacts 154 may be formed above the scallops 156 in a generally circular pattern around the substrate seating surface 152 of the contact ring 150. The contacts 154 may vary in number, for example, according to a size of the substrate 120 (not shown in FIG. 2). The contacts 154 may also be flexible to contact non-plating surfaces with non-uniform heights. Power may be supplied to the contacts 154 via a power supply (not shown). The power supply may supply electrical power to all of the electrical contacts 154 cooperatively, banks or groups of the electrical contacts 154 separately, or to the individual contacts 154. In embodiments where current is supplied to groups or individual contacts 154, a current control system may be employed to control the current applied to each group or pin.

For some embodiments, the contact ring 150, attachment members 116 and mounting member 112 may all be made of an electrically conductive material. As with the contacts 154, the contact ring 150, attachment members 116 and mounting member 112 may be made of any suitable electrically conductive material and, for some embodiments, may be made of stainless steel. Accordingly, the attachment members 116 may electrically couple the mounting member 112 and the contact ring 150. Therefore, power may be supplied to the contacts 154 by one or more electrical connections between the mounting member 112 and a power supply.

Further, for some embodiments, the mounting member 112 may be physically and electrically coupled with the thrust plate mounting plate 146, which may also be made of an electrically conductive material and may be attached to a power supply. The mounting member 112 or mounting plate 146 may be connected to the power supply via any suitable attachment means adapted to provide power to the contacts 154 as the substrate securing assembly 110 is moved (i.e., raised, lowered and rotated) by the head assembly 102 of FIG. 1.

As previously described, the seal plate 142 may be attached to the thrust plate 144. The thrust plate 144 may be adapted to move (i.e., up and down) independently of the contact ring 150 to exert a securing force with the sealing member 148 on the non-plating surface of a substrate to secure the substrate to the substrate seating surface 152 of the contact ring 150. The sealing member 148 may be designed to provide a uniform contact force between the contacts 154 and the plating surface of the substrate.

For example, the sealing member 148 may be made of a pliable material designed to decrease an effective spring constant of the sealing member 148. In other words, the sealing member 148 may compress to adapt to slight non-uniformities in the non-plating surface of the substrate (or slight non-uniformities in the annular sealing member 148). For example, as the sealing member 148 compresses, less force may be needed to seal against the highest point of the non-plating surface before sealing against the lowest point. With less force difference between the highest and lowest points, the local force on the non-plating surface of the substrate, and therefore on the contacts 154 in contact with the plating surface of the substrate, may be more uniform. A more uniform force on the contacts 154 may lead to uniform contact resistance and improved plating uniformity.

The plurality of scallops 156 may be formed on a bottom surface of the contact ring 150 below the plurality of contacts 154. The size and shape of the scallops 156 are not limited and may vary according to different applications. For example, as illustrated in FIG. 2, the scallops 156 formed below the contacts 154 may be substantially rectangular in shape. For other embodiments, however, scallops may be other shapes, including, but not limited to rounded shapes (e.g., semi-cylindrical or hemispherical) and triangular shapes (e.g., pyramid or saw-tooth shaped). As illustrated, the scallops 156 may extend from a bottom surface of the contact ring 150 (e.g., opposite the substrate seating surface 152). However, for other embodiments, scallops may extend from the substrate seating surface 152, in effect raising the contacts 154.

Figure 3A:
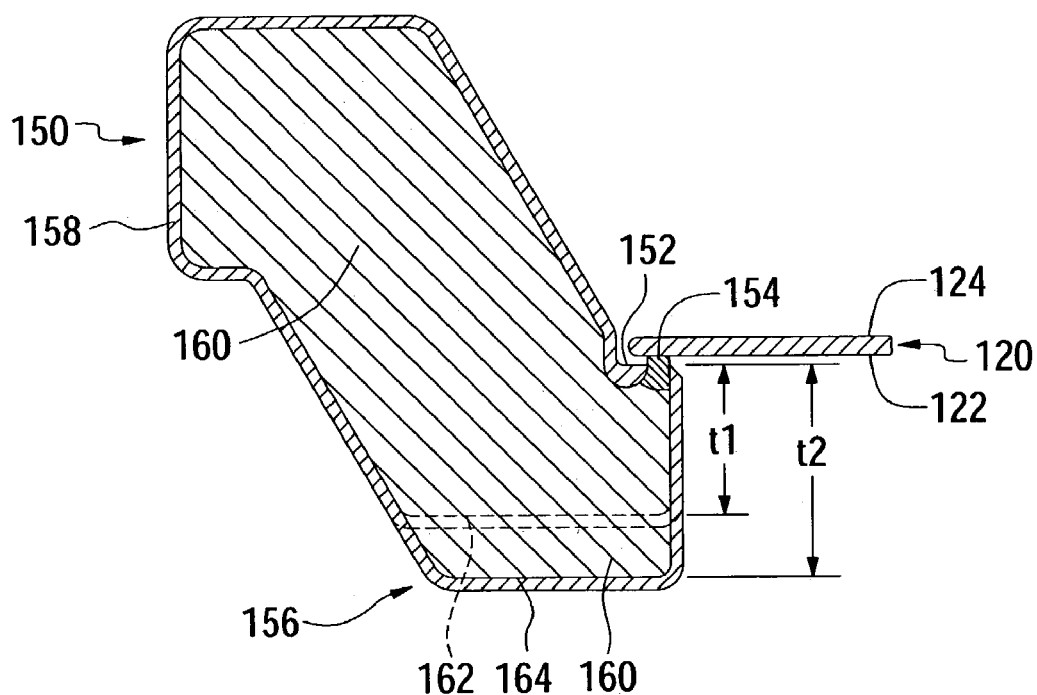
FIGS. 3A–D are detailed cross sectional views of contact rings according to embodiments of the present invention.

FIG. 3A is a detailed cross sectional view of the contact ring 150. As illustrated, the contact ring 150 may have a thickness t1 between contacts 154, and a thickness t2 at the scallops 156. The thickness t1 and t2 may be measured from the substrate seating surface 152 to a bottom surface 162 of the contact ring 150 between the contacts 154 and a bottom surface 164 of the contact ring 150 below the contacts, respectively. In general, as t2 increases, an amount of current density at or near the contacts 154 decreases, and an amount of plating at or near the contacts 154 decreases. Similarly, as t1 decreases, an amount of current density between the contacts increases, and an amount of plating between the contacts 154 increases. By controlling the ratio of thickness t2 to t1, uniform current density and, thus, non-uniformities in plating thickness around a perimeter edge of the substrate 120 may be reduced.

As illustrated, the contact ring 150 may be formed of an electrically conductive core 160 surrounded by a plating-resistant coating 158. For some embodiments, the conductive core 160 may be a solid piece of conductive material. The contacts 154 may extend from the plating surface 152 through the plating-resistant coating 158. In an effort to maximize a surface area of the plating surface 122 exposed to plating solution, the contacts 154 may be adapted to engage the plating surface 122 of the substrate 120 at or near a perimeter edge. For example, for different embodiments, the contacts 154 may be adapted to engage the plating surface 122 less than 5 mm from an edge of the substrate 120 (e.g., 2.5 mm or 4.5 mm). As previously described, a thrust plate assembly may include a sealing member (not shown in FIG. 3A) adapted to exert a securing force against the non-plating surface 124 of the substrate 120, at a location just opposite the contacts 154, to secure the substrate 120 against the substrate seating surface 152 of the contact ring 150. The sealing member may be adapted to provide a uniform sealing force between the contacts 154 and the plating surface 122, which may help to provide a uniform contact resistance which may help provide a uniform current across the plating surface 122.

Figure 3B:
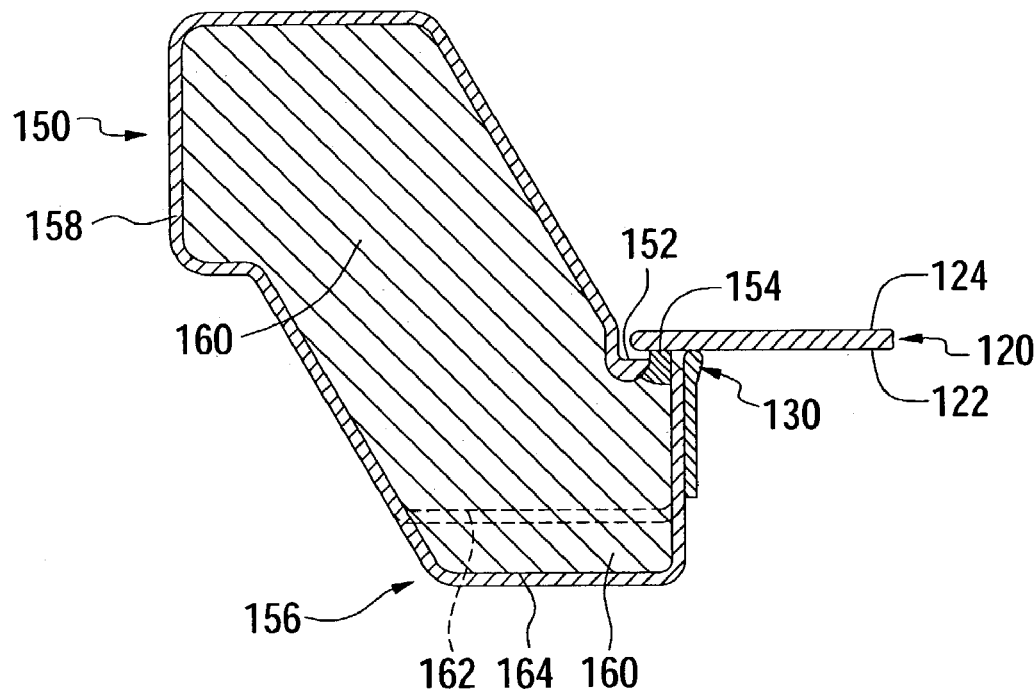

As illustrated in FIG. 3B, for some embodiments, a sealing member 130 attached to the contact ring 150 may be adapted to engage the plating surface 122 of the substrate 120 radially inward from the electrical contacts 154. Accordingly, the sealing member 130 may shield the contacts 154 from the flow of plating solution, which may also help to provide a uniform contact resistance, for example, by preventing plating on the contacts 154.

The current at any point on the plating surface 122 is generally inversely proportional to a sum of seed layer resistance, contact resistance, and electrolyte resistance. As previously described, points on the plating surface 122 between the contacts 154 may see a larger effective seed layer resistance than points on the plating surface at or near the contacts 154. This increase in seed layer resistance may result in decreased current and, therefore, less plating between the contacts 154. However, as illustrated in FIGS. 3C and 3D, the thicker dimension of the scallops 156 may compensate for the increased seed layer resistance between the contacts and, therefore, reduce variations in current along the perimeter of the plating surface 122.

Figure 3C:
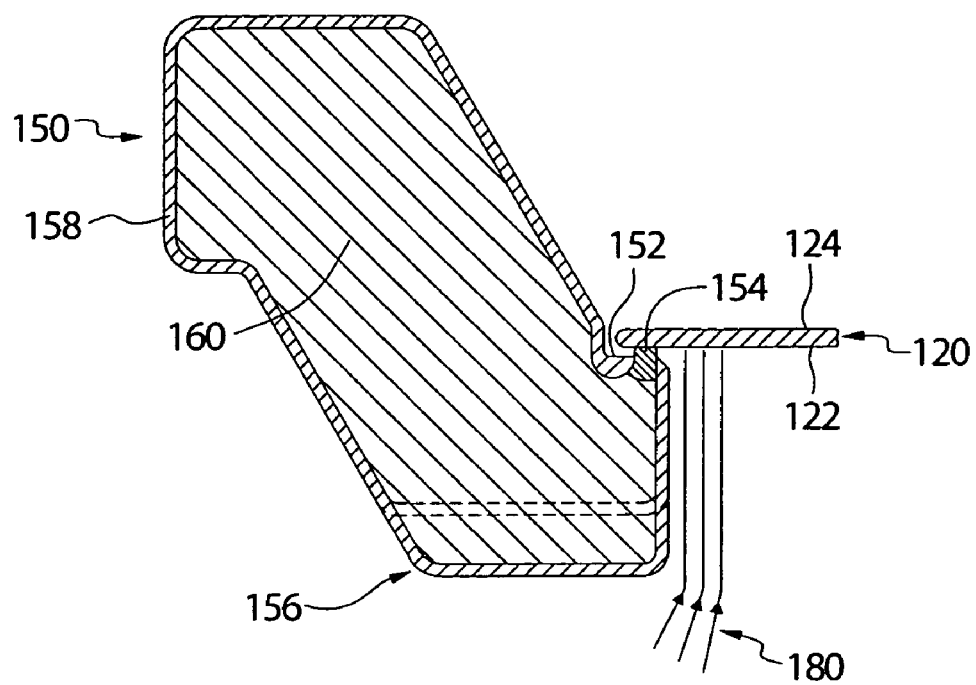
Figure 3D:
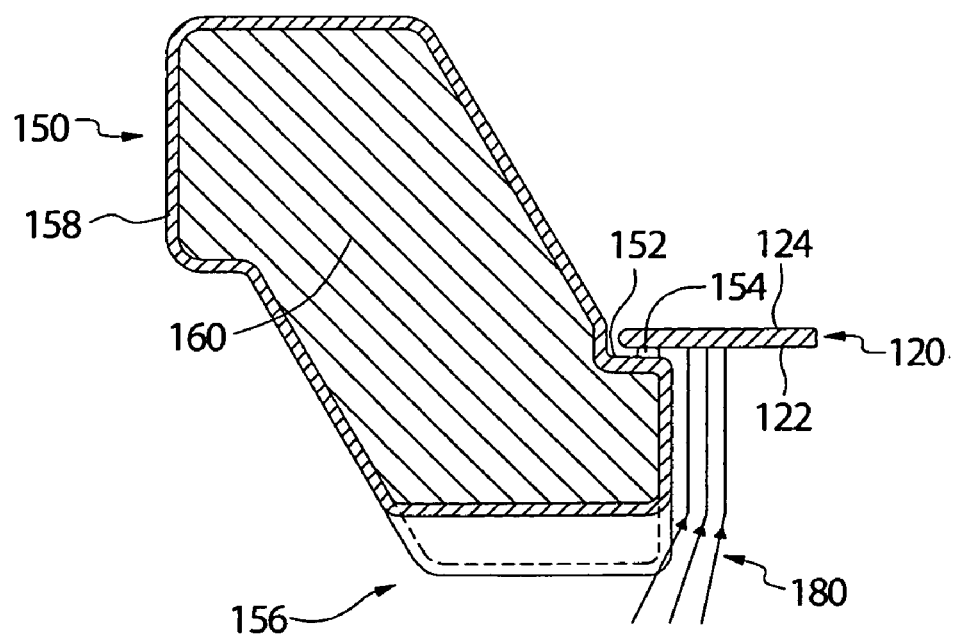

FIG. 3C illustrates current flux lines 180 extending to the plating surface 122 beneath the contacts 154, while FIG. 3D illustrates flux lines 180 extending to the plating surface 122 between the contacts 154. As illustrated, in either case, the flux lines 180 tend to squeeze together around the contact ring 150, which effectively increases an effective resistance of the plating solution. However, due to the increased thickness of the scallops 156, the flux lines 180 in FIG. 3C are squeezed together for a longer distance than the flux lines 180 in FIG. 3D. Accordingly, in regions between the scallops 156, there is a lower effective resistance of the plating solution, which may compensate for increased seed layer resistance between the contacts 154.

Figure 4A:
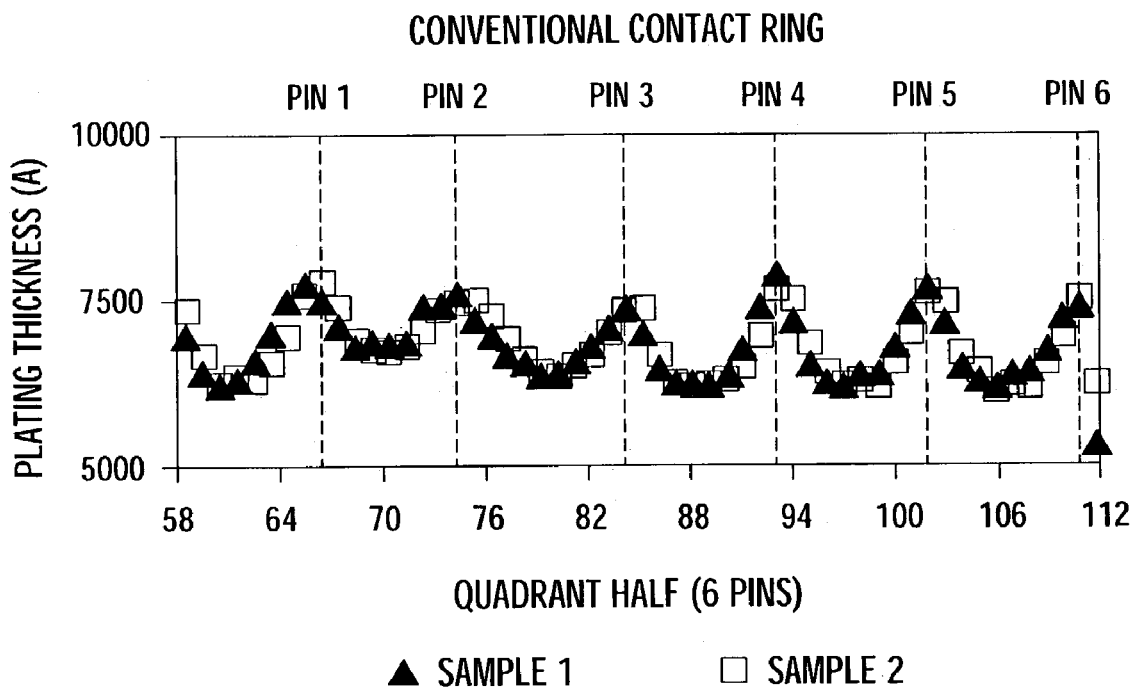
FIGS. 4A–B are graphs illustrating plating uniformity achieved using a conventional contact ring and a contact ring according to an embodiment of the present invention, respectively.
Figure 4B:
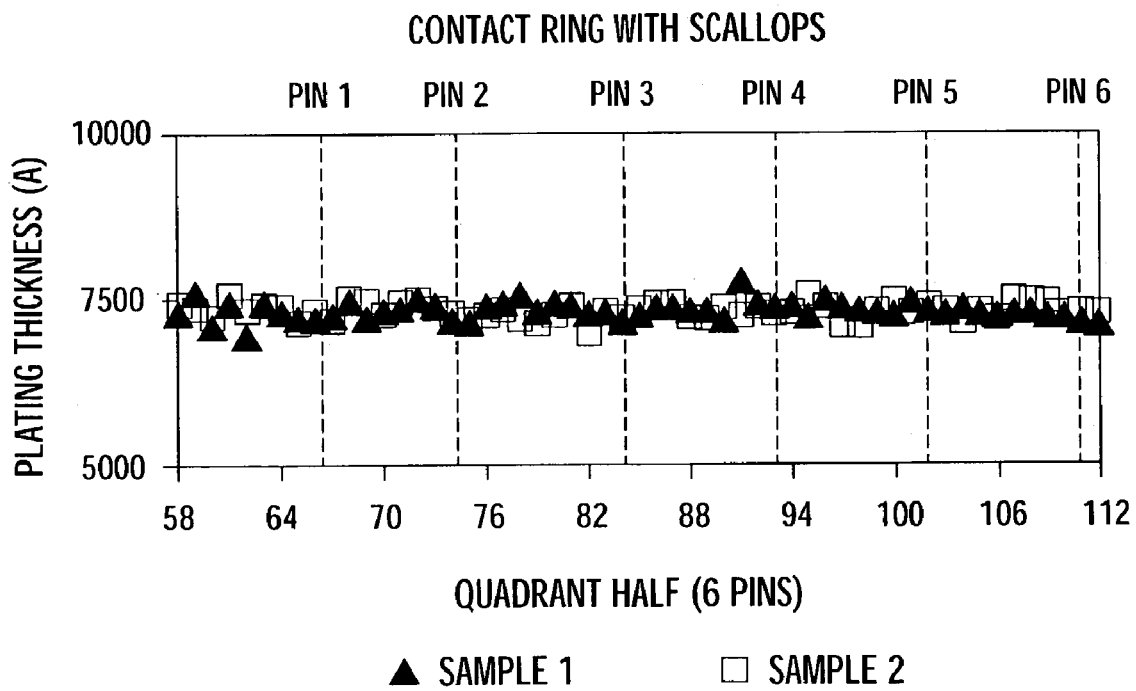

FIGS. 4A–B are graphs illustrating plating uniformity achieved using a conventional contact ring and a scalloped contact ring, respectively. The graphs each show sampled plating thickness along a perimeter edge for 2 300 mm substrates having a 40 nm seed layer. The plating thickness were sampled along a half quadrant (e.g., 45 degrees) of a perimeter. As illustrated, the half quadrant may include 6 contacts, labeled as pins in the figures (i.e, there may be 48 contacts total). The sample substrates of FIG. 4A were plated using a conventional contact ring having a uniform thickness of approximately 7 mm (i.e., below and between the contacts). The sample substrates of FIG. 4B were plated using a scalloped contact ring having a thickness of 5 mm between the contacts (t1) and 7 mm below the contacts (t2). As illustrated in FIG. 4A, using the conventional contact ring, plating thickness increases at or near the contacts, and decreases between the contacts. For example, the plating thickness may vary from approximately 8000 Angstroms at or near the contacts to less than 6500 Angstroms at points between the contacts. In contrast, as illustrated in FIG. 4B, using the scalloped contact ring, plating thickness varies only slightly. Of course actual plating uniformity may vary for different embodiments and for different applications.

Accordingly, for different applications, the size and shape of the scallops may be varied to achieve optimal plating uniformity. For example, the thickness of the contact ring between the scallops (t1) and the thickness of the contact ring (t2) may be varied based on different application parameters, such as seed layer thickness, desired plating thickness, substrate size, strength of the electrical bias, material being plated, etc. In other words, t2 may be increased as necessary to decrease plating thickness at or near the contacts, while t1 may be decreased as necessary to increase plating thickness between the contacts. As illustrated in the example above, for one embodiment, the thickness t2 may be approximately 7 mm, while the thickness t1 may be approximately 5 mm. The thickness t2 (beneath the contacts) may typically be in a range from 3 mm to 9 mm, while the thickness t1 (between the contacts) may typically be in a range from 1 to 5 mm.

Contact Ring Fabrication

As described above, uniform contact resistance may also promote uniform plating thickness. Therefore, for some embodiments, a contact ring may be fabricated according to a process with operations intended to ensure uniform contact resistance. FIGS. 5A–5F illustrate top views (e.g., looking down at the substrate seating surface) of an exemplary contact ring 550 at different steps of a fabrication process according to still another embodiment of the present invention.

Figure 5A:
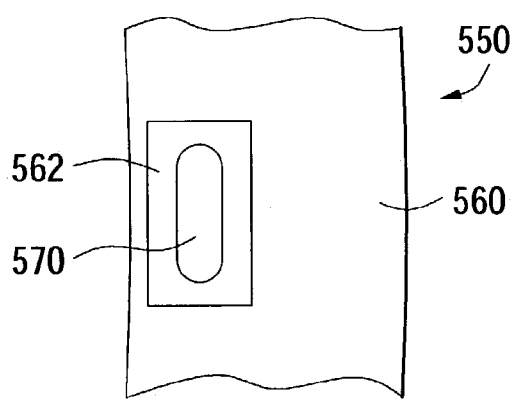
FIGS. 5A–5F illustrate an exemplary contact ring at different steps of a fabrication process according to another embodiment of the present invention.
Figure 5D:
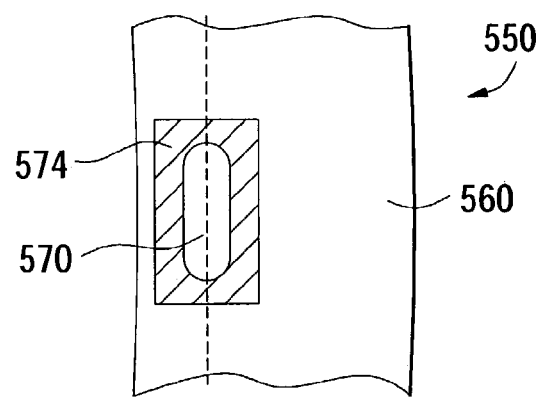

For example, in FIG. 5A, the contact ring 550 may include a single piece of conductive material 560 (e.g., stainless steel). A contact may be formed on the contact ring 550 by bonding a piece of contact material 570 to the contact ring 550. The piece of contact material 570 may be bonded to the contact ring 550 by any suitable bonding technique, such as soldering or welding. (Generally, soldering is performed with metals having melting temperatures below 450° C., while brazing is performed with metals having melting temperatures above 450° C.) For some embodiments, the piece of contact material 570 may be bonded via a brazing process. For example, the piece of contact material 570 may be placed in a cavity 562 formed in the contact ring 550, with a top portion of the contact material 570 protruding above a top surface of the cavity 562.

Figure 5B:
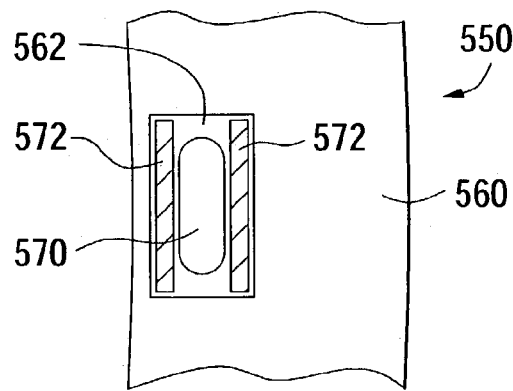

As illustrated in FIG. 5B, one or more pieces of brazing material 572 may be placed in the cavity 562 adjacent the piece of contact material 570. In general, the brazing material 572 should also have a melting temperature below a melting temperature of the conductive material 560 and the contact material 570. The brazing material 572 may also be chosen to have a high corrosion resistance, high purity to avoid contamination, a low vapor pressure at a braze temperature, and the ability to wet the contact material 570 and the conductive material 560. For example, for some embodiments, the contact material 570 may be a platinum-indium alloy (e.g., 85% platinum, 15% indium) having a melting temperature of approximately 2230° C. and the conductive material 560 may be stainless steel having a melting point of approximately 1650° C. One example of a suitable brazing material 572 for brazing platinum-indium alloy contacts to a stainless steel contact ring (e.g., with the properties described above) is a palladium-cobalt alloy (e.g., 65% palladium, 35% cobalt) having a melting temperature of approximately 1220° C. In other words, the contact ring 550 may be heated (e.g., in a furnace), to a temperature above the melting point of the brazing material 572 (e.g., above 1220° C.), causing the brazing material 572 to melt and form a single piece of brazing material 574 that anchors the contact material 570 to the contact ring 550, as illustrated in FIG. 5C. Advantages of brazing may include increased contact lifetime, more uniform contact height and more uniform contact resistance.

As previously described, it is generally desirable to maximize an amount of plating surface area of a substrate. Therefore, for some embodiments, an inner annular portion of the contact ring 550, indicated by dashed lines in FIG. 5D, may be removed (e.g., machined off) to prevent the removed portion from shielding the substrate from plating solution and to allow the contacts being formed to contact a plating surface of the substrate near an edge of the substrate.

Figure 5E:
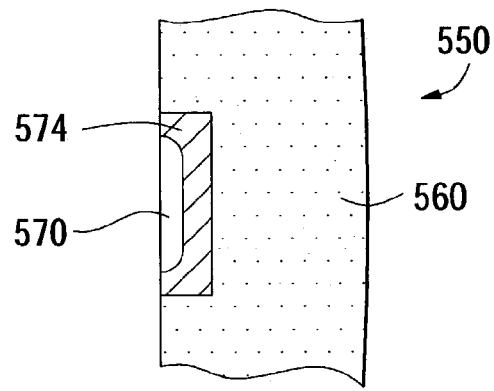
Figure 5C:
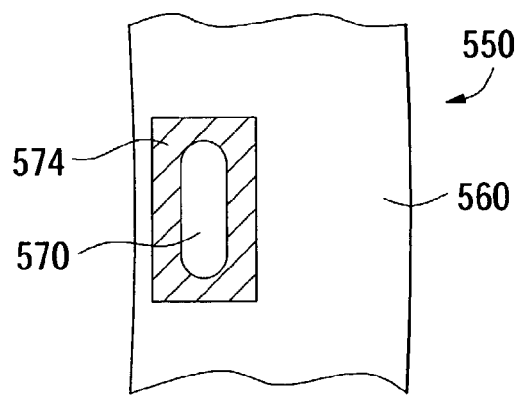

FIG. 5E illustrates the contact ring 550 after removing the annular inner portion. For some embodiments, prior to applying a coating of plating-resistant material 558 (shown in FIG. 5F), a surface of the conductive material 560 of the contact ring 550 may be treated to improve adhesion of the plating-resistant material 558 to the contact ring 550. For example, the surface of the conductive material 560 may be grit blasted which may alter a surface finish of the conductive material 560 and improve adhesion of the plating resistant material 558. Grit blasting may also prevent the plating resistant material 558 from sliding over the top of the contact material 570 over time, which may prevent sufficient electrical contact between the plating surface of the substrate and the contact and, consequently, increase contact resistance. Further, for some embodiments, a coating of primer material may be applied to the surface of the conductive material 560 in addition to, or instead of, grit blasting the surface, to improve adhesion of the plating-resistant material 558.

Figure 5F:
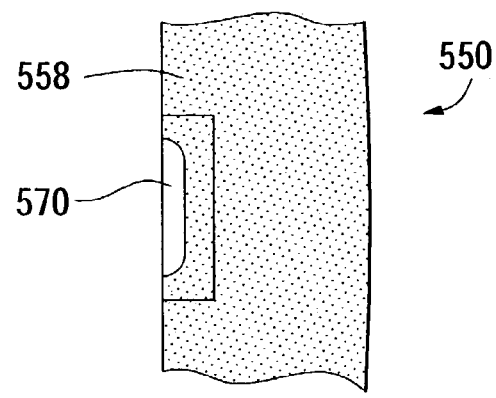

FIG. 5F illustrates the final contact ring 550 after applying the coat of plating-resistant material 558. As illustrated, a portion of the contact material 570 is exposed through the coat of plating-resistant material 558, allowing the contact material 570 to engage a plating surface of a substrate. For some embodiments, the contact material 570 may be masked prior to applying the coat of plating-resistant material 558, to prevent coating the contact material with plating-resistant material 558. For other embodiments, the coat of plating-resistant material 558 may be applied to the contact material 570, and subsequently removed.

While the foregoing is directed to embodiments of the present invention, other and further embodiments of the invention may be devised without departing from the basic scope thereof, and the scope thereof is determined by the claims that follow.

The invention claimed is:

1. An apparatus for providing an electrical bias to a substrate in a processing system, comprising:
    a conductive annular body defining a central opening, the conductive annular body having a substrate seating surface adapted to receive the substrate and a plurality of protrusions formed on a surface opposing the substrate seating surface; and
    a plurality of electrical contacts formed on the substrate seating surface opposite the plurality of protrusions, the electrical contacts adapted to engage a plating surface of the substrate.

2. The apparatus of claim 1, wherein the protrusions are substantially rectangular in shape.

3. The apparatus of claim 2, wherein a first thickness of the conductive annular ring measured from the substrate seating surface to the opposing surface is in a range from alpproximately 3 mm to alpproximately 9 mm at the protrusions and alpproximately 1 mm to alpproximately 5 mm between the protrusions.

4. The apparatus of claim 1, wherein the electrical contacts are bonded to cavities formed in the substrate seating surface of the conductive annular body.

5. The apparatus of claim 4, wherein electrical contacts are brazed to the cavities formed in the substrate seating surface of the conductive annular body.

6. The apparatus of claim 5, wherein the electrical contacts are formed of a platinum-indium alloy and are brazed into the cavities using a palladium-cobalt alloy as a brazing material.

7. The apparatus of claim 6, further comprising an annular mounting member coupled with the conductive annular member for attachment to a substrate positioning assembly of the processing system, wherein the annular mounting member is electrically conductive and the annular mounting member is electrically coupled with the conductive annular body via conductive attachment members.

8. The apparatus of claim 7, wherein a spacing of the conductive attachment members is greater than a diameter of the substrate.

9. The apparatus of claim 1, wherein the conductive annular body comprises a solid conductive core coated with a plating-resistant material and wherein the electrical contacts extend through the plating-resistant material.

10. The apparatus of claim 1, further comprising an annular sealing member attached to the conductive annular ring, the annular sealing member adapted to engage the plating surface of the substrate radially inward from the electrical contacts.

11. An apparatus for securing a substrate in a processing system, comprising:
    a contact ring comprising a conductive annular body defining a central opening, the conductive annular body having a substrate seating surface, a plurality of electrical contacts disposed on the substrate seating surface, the electrical contacts adapted to engage a plating surface of the substrate, and a plurality of protrusions formed opposite the electrical contacts on a surface opposing the substrate seating surface; and
    a thrust plate assembly comprising a thrust plate adapted to exert a securing force on the substrate to secure the substrate to the substrate seating surface.

12. The apparatus of claim 11, wherein the thrust plate assembly further comprises an annular sealing member adapted to engage a non-plating surface of the substrate as the thrust plate exerts the securing force on the substrate.

13. The apparatus of claim 12, wherein the annular sealing member is adapted to engage the non-plating surface of the substrate at a substantially equal distance radially inward from an edge of the substrate as the electrical contacts engage the plating surface of the substrate.

14. The apparatus of claim 12, wherein the annular sealing member is formed of surface of a seal plate attached to the thrust plate.

15. The apparatus of claim 11, wherein a first thickness of the conductive annular ring measured from the substrate seating surface to the opposing surface is alpproximately 7 mm at the protrusions and alpproximately 5 mm between the protrusions.

16. The apparatus of claim 11, wherein the plurality of electrical contacts are brazed into cavities formed in the substrate seating surface of the conductive annular body.

17. The apparatus of claim 11, wherein the contact ring further comprises an annular mounting member attached to the contact ring via attachment members.

18. The apparatus of claim 17, wherein the annular mounting member is attached to a mounting plate of the thrust plate assembly.

19. The apparatus of claim 18, wherein the mounting plate and annular mounting member are electrically coupled to the contact ring via the attachment members and the mounting plate is connected to a power supply.

20. A method of fabricating a contact ring for providing an electrical bias to a substrate in a processing system, comprising:
    providing a conductive annular ring having a substantially flat first surface adapted to receive the substrate and a second surface opposing the first surface, wherein a plurality of protrusions protrude from the second surface; and
    forming a plurality of electrical contacts on the first surface of the conductive annular ring, wherein the plurality of electrical contacts are formed above the plurality of protrusions.

21. The method of claim 20, wherein forming the plurality of electrical contacts comprises bonding the electrical contacts to cavities formed in the first surface.

22. The method of claim 21, wherein bonding the electrical contacts to cavities formed in the first surface comprises brazing.

23. The method of claim 22, wherein brazing the electrical contacts comprises brazing the electrical contacts using a palladium-cobalt alloy as a brazing material.

24. The method of claim 21, further comprising removing an inner annular portion of the conductive annular ring, thereby reducing a distance between the electrical contacts and an inner edge of the conductive annular ring.

25. The method of claim 20, further comprising coating the conductive annular ring with a plating-resistant material.

26. The method of claim 25, further comprising coating the conductive annular ring with a primer material prior to coating the conductive annular ring with the plating-resistant material.

27. The method of claim 25, further comprising altering a surface finish of the conductive annular ring prior to coating the conductive annular ring with the plating-resistant material.

28. The method of claim 27, wherein altering the surface finish of the conductive ring comprises grit blasting.

29. A processing system, comprising:
a plating bath assembly containing a plating solution; and
a substrate securing assembly configured to secure a substrate while exposing the substrate to the plating solution, the substrate securing assembly including a conductive annular body defining a central opening, the conductive annular body having a substrate seating surface adapted to receive the substrate, a plurality of protrusions formed on a surface opposing the substrate seating surface, and a plurality of electrical contacts formed on the substrate seating surface opposite the plurality of protrusions, the electrical contacts adapted to engage a plating surface of the substrate.

30. The processing system of claim 29, further comprising a thrust plate assembly comprising a thrust plate adapted to exert a securing force on the substrate to secure the substrate to the substrate seating surface.

31. The processing system of claim 30, wherein the thrust plate assembly further comprises an annular sealing member adapted to engage a non-plating surface of the substrate as the thrust plate exerts the securing force on the substrate.

32. The processing system of claim 31, wherein the annular sealing member is adapted to engage the non-plating surface of the substrate at a substantially equal distance radially inward from an edge of the substrate as the electrical contacts engage the plating surface of the substrate.

33. The processing system of claim 31, wherein the substrate securing assembly is electrically coupled to the thrust plate assembly and the thrust plate assembly is attached to a power supply to supply power to the electrical contacts.

34. The processing system of claim 29, wherein the electrical contacts are bonded to cavities formed in the substrate seating surface of the conductive annular body.

35. The processing system of claim 34, wherein the electrical contacts are brazed to the cavities formed in the substrate seating surface of the conductive annular body.

36. The processing system of claim 35, wherein the electrical contacts are formed of a platinum-indium alloy and are brazed into the cavities using a palladium-cobalt alloy as a brazing material.

* * * * *

UNITED STATES PATENT AND TRADEMARK OFFICE
CERTIFICATE OF CORRECTION

PATENT NO. : 7,025,862 B2
APPLICATION NO. : 10/278527
DATED : April 11, 2006
INVENTOR(S) : Harald Herchen et al.

It is certified that error appears in the above-identified patent and that said Letters Patent is hereby corrected as shown below:

On Title Page

Item [73], Assignee: Change the name of the assignee from "Applied Materials" to --Applied Materials, Inc.--

In The Claims

Column 9, Claim 3, Lines 41 and 42: Change all four instances of "alpproximately" to --approximately--

Column 10, Claim 15, Line 34 and 35: Change both instances of "alpproximately" to --approximately--

Signed and Sealed this

Fifth day of September, 2006

JON W. DUDAS
*Director of the United States Patent and Trademark Office*